(12) United States Patent
Kirscht et al.

(10) Patent No.: US 8,008,107 B2
(45) Date of Patent: Aug. 30, 2011

(54) SEMICONDUCTOR WAFER PRE-PROCESS ANNEALING AND GETTERING METHOD AND SYSTEM FOR SOLAR CELL FORMATION

(75) Inventors: Fritz Kirscht, Berlin (DE); Kamel Ounadjela, Belmont, CA (US); Jean Patrice Rakotoniana, Berlin (DE); Dieter Linke, Berlin (DE)

(73) Assignee: Calisolar, Inc., Sunnyvale, CA (US)

( * ) Notice: Subject to any disclaimer, the term of this patent is extended or adjusted under 35 U.S.C. 154(b) by 456 days.

(21) Appl. No.: 11/648,127

(22) Filed: Dec. 30, 2006

(65) Prior Publication Data

US 2008/0157241 A1    Jul. 3, 2008

(51) Int. Cl.
*H01L 21/00* (2006.01)

(52) U.S. Cl. .......... 438/58; 257/E21.001; 257/E21.032; 257/E21.318; 257/E21.321; 257/E21.335; 257/E21.349; 257/E21.122; 257/E27.141

(58) Field of Classification Search .................. 438/58; 257/E21.001, 32, 318, 321, 335, 349, E27.122, 257/141

See application file for complete search history.

(56) References Cited

U.S. PATENT DOCUMENTS

| | | | |
|---|---|---|---|
| 4,062,102 A * | 12/1977 | Lawrence et al. | 438/4 |
| 4,561,171 A | 12/1985 | Schlosser | |
| 4,878,988 A * | 11/1989 | Hall et al. | 438/471 |
| 5,298,449 A * | 3/1994 | Kikuchi | 438/459 |
| 5,738,942 A * | 4/1998 | Kubota et al. | 428/428 |
| 5,927,131 A * | 7/1999 | Kiuchi et al. | 72/274 |
| 6,040,211 A * | 3/2000 | Schrems | 438/238 |
| 6,071,753 A * | 6/2000 | Arimoto | 438/57 |
| 6,093,882 A * | 7/2000 | Arimoto | 136/252 |
| 6,133,119 A | 10/2000 | Yamazaki | |
| 6,261,860 B1 * | 7/2001 | Nagata | 438/58 |
| 6,852,371 B2 * | 2/2005 | Sopori | 427/557 |
| 7,244,306 B2 * | 7/2007 | Kurita et al. | 117/13 |
| 2002/0101576 A1 * | 8/2002 | Shabani et al. | 356/36 |

(Continued)

FOREIGN PATENT DOCUMENTS

EP    0466014    1/1992

(Continued)

OTHER PUBLICATIONS

"European Application Serial No. 07868140.0, Extended European Search Report mailed on Mar. 2, 2011", 6 Pgs.

*Primary Examiner* — Thao X Le
*Assistant Examiner* — Eric W Jones
(74) *Attorney, Agent, or Firm* — Schwegman, Lundberg & Woessner, P.A.

(57) ABSTRACT

Techniques are here disclosed for a solar cell pre-processing method and system for annealing and gettering a solar cell semiconductor wafer having an undesirably high dispersion of transition metals, impurities and other defects. The process forms a surface contaminant layer on the solar cell semiconductor (e.g., silicon) wafer. A surface of the semiconductor wafer receives and holds impurities, as does the surface contaminant layer. The lower-quality semiconductor wafer includes dispersed defects that in an annealing process getter from the semiconductor bulk to form impurity cluster toward the surface contaminant layer. The impurity clusters form within the surface contaminant layer while increasing the purity level in wafer regions from which the dispersed defects gettered. Cooling follows annealing for retaining the impurity clusters and, thereby, maintaining the increased purity level of the semiconductor wafer in regions from which the impurities gettered. Multicrystalline semiconductor wafers having grain boundaries with impurities may also undergo the annealing and gettering of dispersed defects to the grain boundaries, further increasing the semiconductor substrate purity levels.

19 Claims, 5 Drawing Sheets

U.S. PATENT DOCUMENTS

| | | | |
|---|---|---|---|
| 2004/0107648 A1* | 6/2004 | Sung | 51/295 |
| 2005/0126627 A1* | 6/2005 | Hayashida | 136/257 |
| 2005/0158969 A1 | 7/2005 | Binns et al. | |
| 2006/0000414 A1 | 1/2006 | Mercaldi et al. | |
| 2006/0130738 A1* | 6/2006 | Kurita et al. | 117/14 |
| 2006/0289091 A1 | 12/2006 | Buonassisi et al. | |
| 2008/0157241 A1* | 7/2008 | Kirscht et al. | 257/431 |

FOREIGN PATENT DOCUMENTS

| | | |
|---|---|---|
| JP | 09260392 | 10/1997 |
| JP | 2005057054 A * | 3/2005 |
| WO | WO-0178133 A1 | 10/2001 |

* cited by examiner

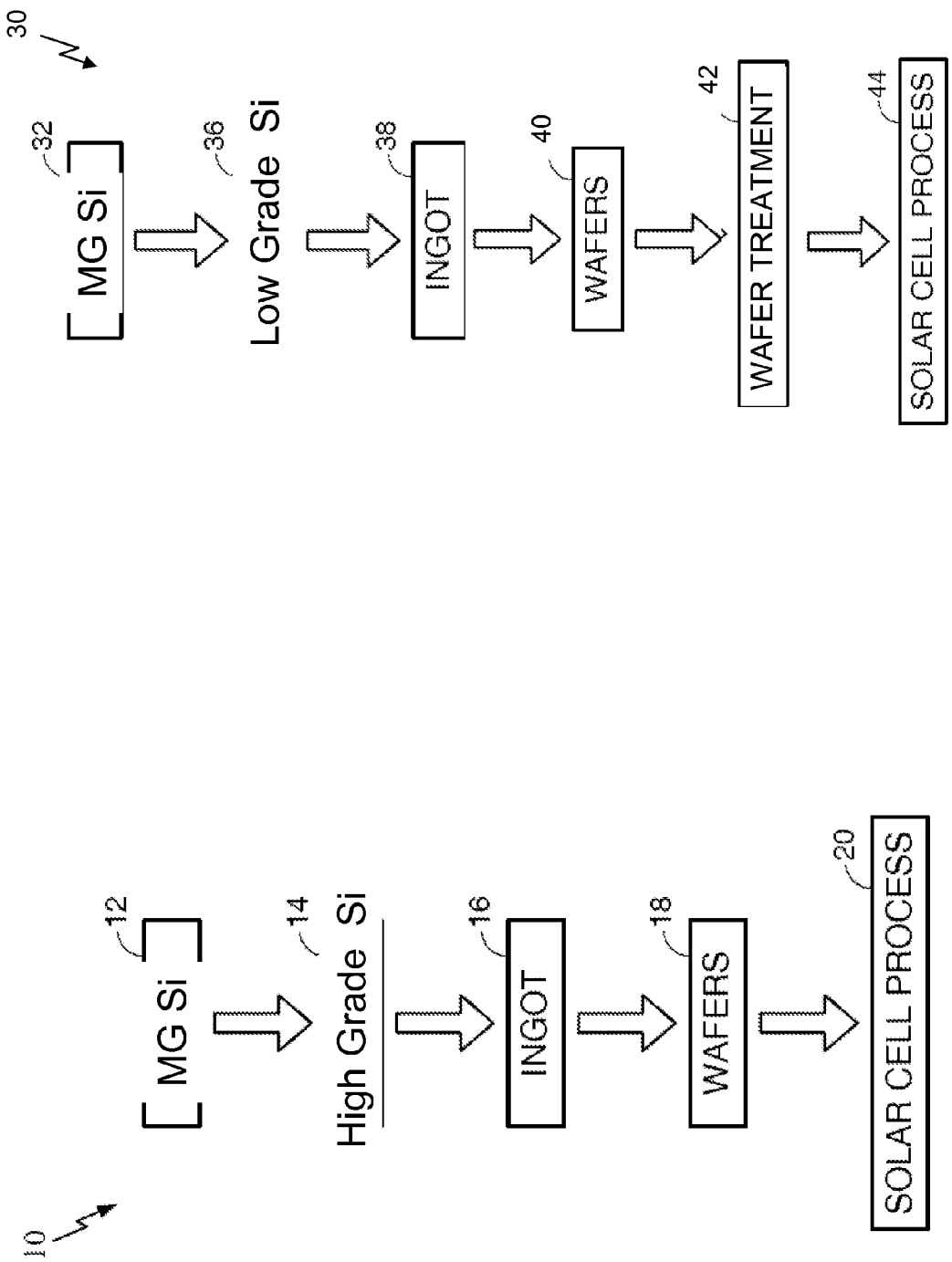

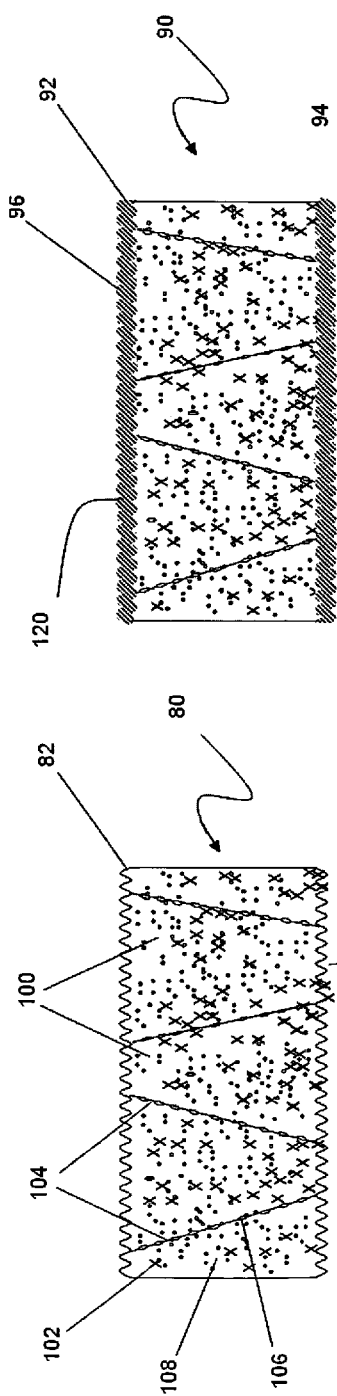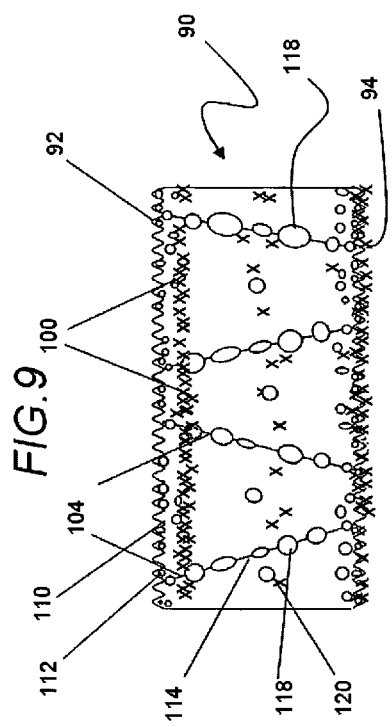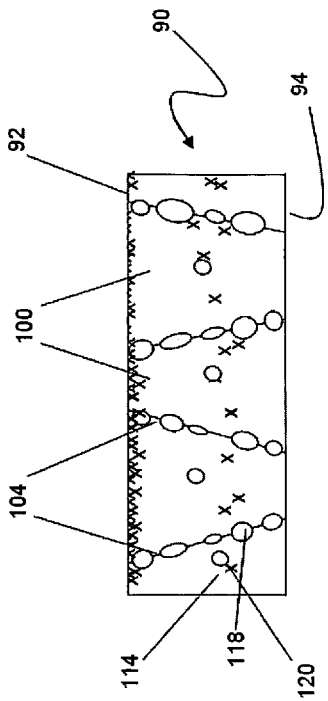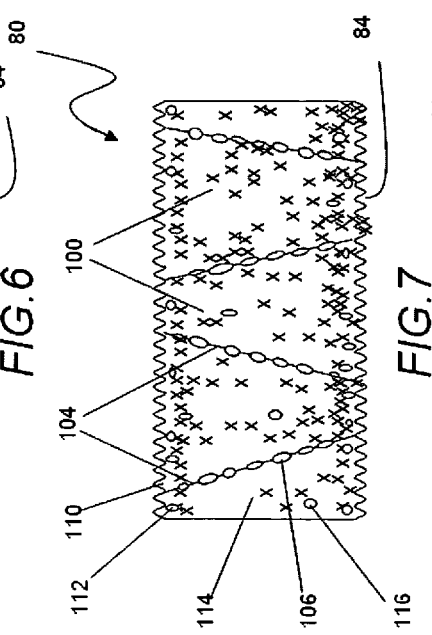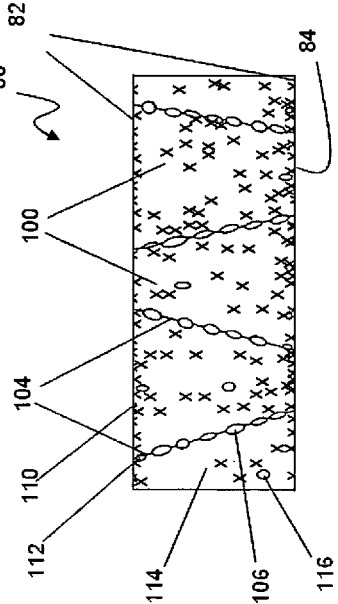

SEMICONDUCTOR WAFER PRE-PROCESS ANNEALING AND GETTERING METHOD AND SYSTEM FOR SOLAR CELL FORMATION

FIELD

The present disclosure relates to methods and systems for use in the fabrication solar cells using semiconductor materials such as silicon. More particularly, the present disclosure relates to an annealing and gettering method which changes defect distributions across a wafer thickness to yield improved semiconductor wafers for forming solar cells.

DESCRIPTION OF THE RELATED ART

Materials alternatives for solar cells range from single-crystal, electronic-grade (EG) silicon to relatively dirty, metallurgical-grade (MG) silicon. EG silicon yields solar cells having efficiencies close to the theoretical limit (but at a prohibitive price), while MG silicon typically fails to produce working solar cells. However, there may be other semiconductor materials that are useful for solar cell fabrication. In practice, however, nearly 90% of commercial solar cells are made of highly purified EG silicon.

Several factors determine the quality of raw silicon material that may be useful for solar cell fabrication. These factors may include, for example, transition metal and dopant content and distribution. Transition metals pose a principal challenge to the efficiency of multicrystalline silicon solar cells. Multicrystalline silicon solar cells may tolerate transition metals such as iron (Fe), copper (Cu), or nickel (Ni) in concentrations up to $10^{16}$ cm$^{-3}$, because metals in multicrystalline silicon are often found in less electrically active inclusions or precipitates, often located at structural defects (e.g., grain boundaries) rather than being atomically dissolved. However, no simple correlation exists between the total metal content of the semiconductor wafer and cell efficiencies across different. Accordingly, understanding the physics and the properties of metal clusters in solar cells, as well as using these properties to operational and economic advantage, could yield significant process and product improvements. Such improvements are likely to further enhance the attractiveness of solar power for an essentially unlimited number of energy demands.

The purity requirements for the semiconductor materials useful for solar cells typically are not as stringent as are those for the integrated circuitry industry. In fact, the solar cell industry may sometimes use recycled, scrapped, or rejected semiconductor material from the integrated circuitry industry. However, transition metal impurities are known to decrease the solar cell conversion efficiency. This leads to poor performance and a poor cost-to-performance ratio. While the impurities may be removed using a variety of well-known techniques for purifying silicon, known techniques add additional cost to the solar cell manufacturing process. This, in essence, vitiates the motivation for using such lower quality MG silicon wafers.

Therefore, there exists a need for the formation of solar cells using low-cost semiconductor materials such as MG or even upgraded MG (UMG) silicon, to demonstrate the operational performance levels attainable using EG silicon materials.

There is a need for a method and system for processing MG silicon wafers that causes metallic impurities and other electrically active species, such as structural defects and other lattice irregularities or defects to less negatively affect solar cell performance characteristics, thereby allowing profitable use of such lower cost wafers for solar cells.

A need exists for a semiconductor wafer pre-processing method and system for mitigating the effects of transition metals and other electrically active impurities in semiconductor wafers that may be used in solar cells.

SUMMARY

Techniques are here disclosed for providing improved semiconductor solar cells using low grade semiconductor material. Such low grade semiconductor material may include large amounts of metallic impurities. However, using the present disclosure results in high performance solar cells, which performance levels may approximate those of solar cells using high quality EG silicon. Principally, the present disclosure relates to silicon materials, although use of other semiconductor materials may be within the scope of the presently claimed method and system.

According to one aspect of the disclosed subject matter, a solar cell pre-processing method and associated system are provided for annealing and gettering (i.e., trapping a neutralization of) impurities, such as transition metals, impurities and other defects. The pre-processing method forms one or more surface contaminant layers on a semiconductor wafer. The one or more surface contaminant layers associates with one or more near-surface layers of the semiconductor wafer, which one or more near-surface layers contains enhanced amounts of lattice defects. The lattice defects are predisposed to receive and hold impurities and related clusters, while the semiconductor wafer includes a bulk region with lattice defects, impurities and related clusters, all of which are generally more or less dispersed throughout the semiconductor wafer bulk. The method includes annealing the semiconductor wafer to a temperature sufficient for gettering the impurities to within near-surface layers and the impurities within the wafer bulk. Then, the method includes cooling the semiconductor wafer following the annealing step to retain the impurities as respective impurity clusters predominantly within the one or more surface contaminant layers and partially within the wafer bulk. The result becomes an increased impurity level of the semiconductor wafer predominantly in near-surface layers and a change in the more or less dispersed distribution of defects and impurities to a depth-dependent distribution within the semiconductor wafer. Moreover, the method and system result in a removal of the surface contaminant layer(s) including the impurity clusters, for yielding a semiconductor wafer having a generally higher purity level close to one or more wafer surface. That is, the method and system create a "denuded zone" within the wafer.

In the event that the semiconductor wafer uses multicrystalline semiconductor, the multicrystalline semiconductor bulk may include generally dispersed grain boundaries. The generally dispersed grain boundaries include a threshold level of impurities, and the disclosed method and system allow for performing the annealing step to a temperature sufficient for gettering the impurities to form impurity clusters in the grain boundaries. The result is to increase the purity level of the semiconductor wafer in regions from which the impurities and defects gettered.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages be included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference characters identify correspondingly throughout and wherein:

FIG. 1 depicts a known process for forming a semiconductor solar cell;

FIG. 2 illustrates generally an aspect of the disclosed subject matter for forming a semiconductor solar cell;

Figure 3:
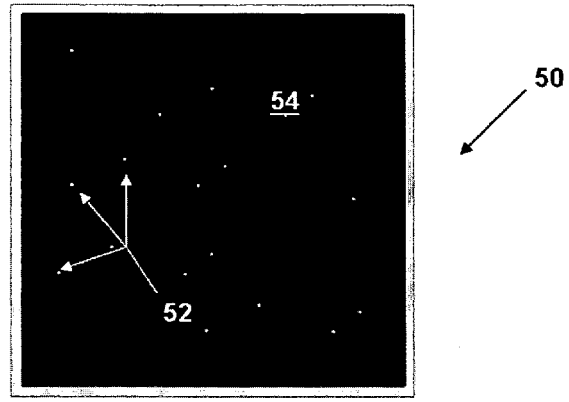
Figure 4:
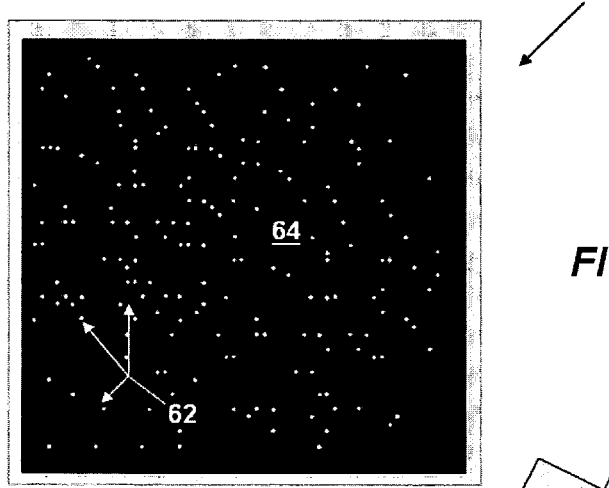
Figure 5:
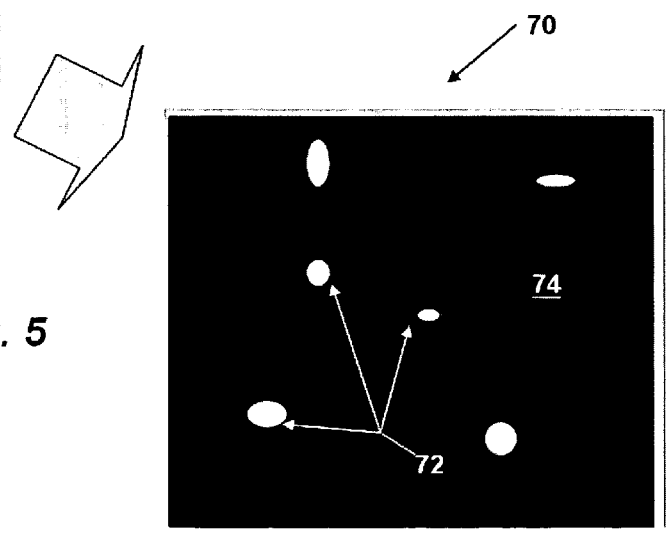
Figure 12:
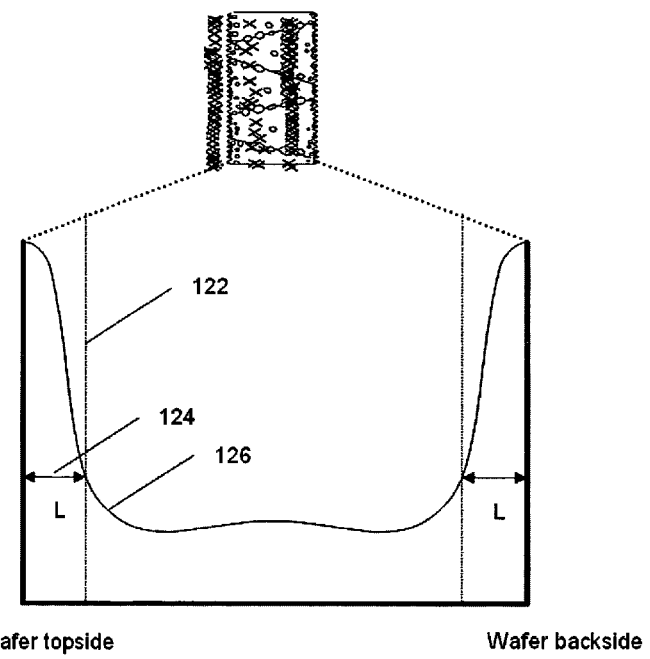

FIG. 3 conceptually presents an EG semiconductor substrate for comparing to a semiconductor substrate modified according to the present teachings;

FIGS. 4 and 5 conceptually show a semiconductor wafer having impurities and impurities experiencing the benefits of the disclosed process;

FIGS. 6 through 11 illustrate contrasting process steps for the presently disclosed process; and FIG. 12 conceptually illustrates the resulting in-depth distribution of electrically active impurities arising from the process of FIGS. 6 through 11.

Figure 13:
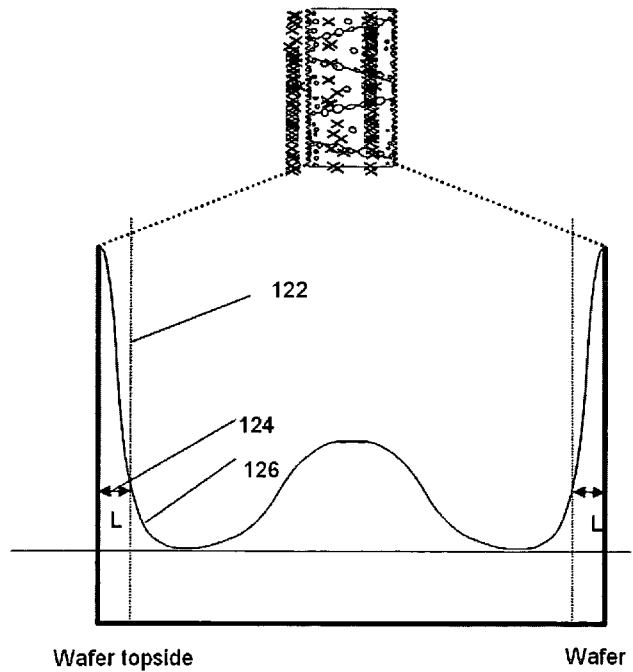

FIG. 13 shows another in-depth distribution of electrically active species according to an embodiment of the invention.

Figure 14:
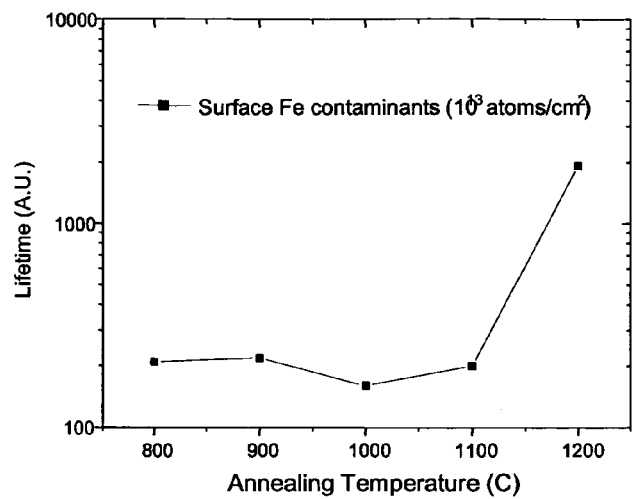

FIG. 14 shows a graph of recombination lifetime versus temperature for material formed according to an embodiment of the invention.

Figure 15:
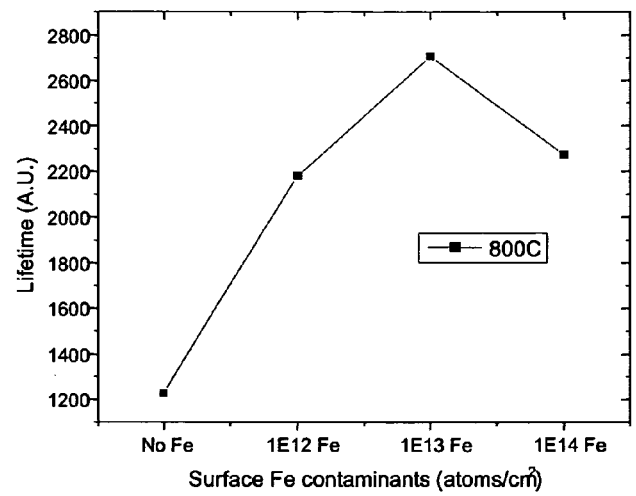

FIG. 15 shows a graph of recombination lifetime versus surface concentration for material formed according to an embodiment of the invention.

DETAILED DESCRIPTION OF THE SPECIFIC EMBODIMENTS

The method and system of the present disclosure provide an annealing and gettering process for concentrating impurities and related complexes, in particular transition metal clusters, existing throughout a semiconductor substrate. As a result of using the presently disclosed subject matter, an improvement in the properties of low-grad semiconductor materials, such as MG or UMG silicon occurs. Such improvement allows use of refined MG (RMG) silicon, for example, in producing solar cells as may be used in solar power generation and related uses. The method and system of the present disclosure, moreover, particularly benefits the formation of semiconductor solar cells using MG or other non-electronic grade semiconductor materials. The present disclosure may find application in the economical manufacture of solar cells, allowing the formation of solar cells in greater quantities and in a greater number of fabrication facilities than has heretofore been possible.

Among various technical advantages and achievements herein described, certain ones of particular note include the ability to reduce the amount of impurities present in a semiconductor wafer such as a silicon wafer in a process occurring prior to the standard solar cell fabrication. The disclosed subject matter enables processes for inexpensively making wafer treatments needed for highly efficient mass scale solar cell production. Still further, the present disclosure makes possible advantageous use of saw damage that may be inherently present after slicing a silicon ingot into wafers. That is the inherent saw damage that occurs in slicing a semiconductor wafer benefits attracting impurities in favorable thermodynamic process conditions. Also, by adding one or more contaminated layers with controlled levels of foreign atoms at the wafer surface, the disclosed process supports gettering impurities during a favorable thermodynamic treatment. The foreign atoms may include metals (e.g., iron and copper) and non-metals (e.g., phosphorus). The process of the present disclosure removes a highly contaminated layer at the surface of the wafer using etching prior to the solar cell fabrication. The process, thereby, reduces the concentration of electrically active species within grains, while concentrating metallic impurities at the multicrystalline silicon grain boundaries. Such active species may include dislocations and metallic impurities. The disclosed subject matter, therefore, generates denuded zones in silicon wafers by applying treatments that reduce the concentration of non-surface electrically active species. Such non-surface electrically active species may be, for example, intra-grain dislocations and metallic impurities.

Laying a context for the present disclosure, FIG. 1 depicts a known process 10 beginning at step 12. At step 12, MG or other low-grade silicon enters known wafer forming process flow 10. Known process flow 10 extracts high-grade silicon from MG silicon at step 14. High-grade silicon extraction step 14 is a high-cost processing sequence resulting in EG silicon or somewhat relaxed silicon quality called Solar-grade (SoG) silicon quality. Those are the types of silicon feedstock materials used for making the ingot in step 16. Known process flow 10 includes slicing the silicon ingot, generally using a wire-saw to derive a silicon wafer at step 18. The resulting silicon wafers then enter solar cell formation process 20 using the resulting wafer.

FIG. 2 depicts, in general terms, novel aspects of the disclosed solar cell forming process flow 30. Process flow 30 includes using MG silicon at steps 32 that is purified to some degree to become RMG silicon. The silicon quality reached is still a low-grade silicon 36. Accordingly, silicon quality 36 relates to much lower cost as compared to silicon quality 14. Also, silicon quality 36 means much higher content of metallic and other impurities as compared to silicon quality 14. Thereafter, at step 38, silicon ingot formation may occur. Step 40 represents the formation of silicon wafers, i.e., slicing from the silicon ingot. Then, the novel aspect of the disclosed solar cell forming process flow is introducing a wafer treatment step 42, also called pre-process step, before starting the cell process. Finally, the solar cell forming process occurs at step 44.

FIG. 3 further establishes the context of the disclosed subject matter by depicting conceptually a high quality, EG silicon wafer 50. Silicon wafer 50 includes pure silicon substrate 52 which, even in the most pure form, contains at least trace impurities and some level of structural defects 54. Generally, such impurities and defects only affect solar cell performance slightly. However, there is always some performance cost for these impurities and defects. The performance costs of potential or actual solar cell operation limitation must, however, weigh against the time, effort, and process expense costs of their removal. In known EG silicon wafers used for solar cells, a balance between costs of using EG silicon, on the one hand, and performance, on the other hand, exists. The result becomes solar cells with satisfactory performance for most demands, yet with unacceptable manufacturing costs.

In contrast, FIG. 4 shows a lower quality, lower cost, and more abundant silicon wafer 60 having metallic and other impurities and a variety of lattice defects 62. Impurities and defects 62 are somewhat uniformly distributed throughout silicon substrate 64. FIG. 5 shows that the disclosed process employs novel applications of annealing and gettering to transform silicon wafer 60 into silicon wafer 70 having clusters of metallic impurities 72. That is, through the presently disclosed process and system, a significant amount of impurities 62 migrate to form impurity clusters 72 at desired locations, such as near-surface layers or grain boundaries of silicon wafers 74.

The present disclosure includes significant use of internal gettering, external gettering, and manipulation of a "denuded zone" to achieve silicon wafers having properties similar to silicon wafer 70 of FIG. 5. The use of a "denuded zone" at the surface of silicon wafer, as well as internal and external gettering for the migration and clustering of transition metals, as described below in FIGS. 6 through 11, offers a combined wafer pre-process that economically transforms heretofore unusable or marginally usable low-grade RMG silicon into silicon for a modified silicon wafer 70. Moreover, due to the non-obvious and elegant simplicity of the combined processes, such modifications yield silicon wafers exhibiting the properties of silicon wafer 70 with minimal additional process complexities or overall fabrication costs.

The present disclosure establishes thermal conditions for (a) dissolving metals from grown-in clusters or precipitates, (b) moving relatively fast diffusing and some portion of relatively slow diffusing metals into the near-surface region with enhanced amounts of lattice defects, and (c) re-distributing some portion of relatively slow diffusing metals to low-impact impurity clusters in the wafer bulk. After annealing, the near-surface layer having impurity clusters may be etched off, as herein described.

FIGS. 6 through 8, therefore, contrast with FIGS. 9 through 11 to illustrate process steps for the presently disclosed process. That is, FIGS. 6 through 8 relate to an annealing and gettering sequence of steps for semiconductor wafer 80, while FIGS. 9 through 11 relate to an annealing and gettering sequence of steps for semiconductor wafer 90. Semiconductor wafer 80 of FIG. 6 includes top surface 82 and bottom surface 84, and semiconductor wafer 90 of FIG. 9 includes top surface 92 and bottom surface 94. As shown in FIGS. 6 and 9, all top surfaces 82 and 92, and bottom surfaces 84 and 94 show wire-sawn damage surfaces. Semiconductor wafer 90 of FIG. 9 differs from semiconductor wafer 80 of FIG. 6 by the formation of surface contaminant layers 96 and 98 on top surface 92 and bottom surface 94, respectively.

Semiconductor substrate 100 appears in semiconductor wafer 80 of FIG. 6; semiconductor substrate 110 in semiconductor wafer 90 of FIG. 9. Semiconductor substrate 100 includes dispersed lattice defects 108, small clusters of metallic impurities 102, grain boundaries 104, and medium-size clusters of metallic impurities 106. Both wafer sides of FIGS. 6 through 11 may be considered as practically identical. As such, the present description of aspects of one side of semiconductor wafer 80 or 90 may apply to either or both sides. Grain boundaries 104 separate lattice orientations and, thereby, individual grains within semiconductor substrates in FIGS. 6 and 9, respectively.

FIG. 6, therefore, depicts the initial state of wire-sawn semiconductor wafer 80, while FIG. 9 shows wire-sawn semiconductor wafer 90 with an added surface contaminant layer 96. Both wafers may be considered essentially identical at this point. Typically, wafers entering a solar cell fabrication facility have two surfaces with wire-saw damage or similar damage. That is, the commonly used technique for slicing a semiconductor ingot into wafers uses a wire-saw. The wire-saw includes a series of mandrels about which a very long wire is looped and then driven through the ingot as a silicon carbide or boron carbide slurry is dripped onto the wire. The wire-sawing technique, for example, may slice a semiconductor ingot using a length of diamond impregnated wire in which the ingot is rotated about its longitudinal axis as the diamond wire is driven back and forth orthogonal to the ingot's longitudinal axis. There may be other ways to use the wire-saw for slicing the semiconductor wafer.

The present disclosure takes advantage of the wire-saw damaged surfaces 82 and 84 of semiconductor wafer 80 or wire-saw damaged surfaces 92 and 94 of semiconductor wafer 90. That is, the wire-saw damage has the characteristics of attracting metallic impurities by lattice damage and related defects generated mechanically and thermally. This means, those structural defects serve as external getter centers for metallic impurities during thermal treatment and post-anneal cooling as indicated in FIGS. 7 and 10.

Generally dispersed, relatively small impurity clusters 102 will partially or almost completely dissolve under proper thermodynamic conditions, and the freed metallic impurities will migrate from a general dispersion within semiconductor substrates 100 or 110 to a concentrated state. As such, there may be other ways beyond the wire saw to cause the now desirable surface conditions. Alternatively, there may be ways of modifying the conventional wire saws and/or sawing processes as may be used in cutting a semiconductor wafer 80 or 90 from a semiconductor ingot. Still further, the present disclosure contemplates the use of various measurements and control means for determining, controlling and varying the amount of wire saw damage that semiconductor wafer 80 or 90 may experience. Such modifications may be designed to enhance the defect gettering effects of the wire-saw damage and are clearly within the scope of the presently claimed subject matter.

Regardless of the wire-saw process employed, at some level, the wafer formation process causes damage which is transformed into suitable lattice defects used for external gettering of metallic impurities. The present disclosure makes novel and significantly advantageous use of wire-saw damaged surfaces 92 and 94 of FIG. 9 semiconductor wafer 90, for instance, by first intentionally and quite non-obviously adding respective surface contaminant layers 96 and 98.

FIGS. 8 and 11 present the semiconductor structures 80 and 90 following etching and cleaning the respective semiconductor-wafers 80 and 90. In this stage the wafers have a near-surface layer denuded of electronically active species and an etch process controlled, relatively smooth surface.

FIGS. 9 through 11 depict semiconductor wafer 90 with added surface contaminant layers 96 and 98. Surface contaminant layers 96 and 98 preferably consist of one or several transition metal contaminant(s). In the case of depositing several metals on the wafer surface(s) it might be done either sequentially or simultaneously, for example from solutions of respective metals. Metal clustering at annealing (FIG. 10) will occur in near-surface regions 118 and also in concentrated form 120 at grain boundaries in the wafer bulk, presupposed the metal concentration(s) in the wafer bulk exceed critical level(s) due to annealing related in-diffusion of added surface metals.

An alternative to the deposition of separate surface contaminant layers 96 or 98 may include the impregnating of wire-saw damaged surfaces 92 and 94 with transition metals or other impurities. Such a process, for example, may be treatment with a chemical solution including a controlled amount of iron in the course of wire sawing. In fact, one embodiment may use a surface concentration in the range $10^{12}$-$10^{14}$ Fe atoms/cm$^3$.

As a result of the gettering and clustering of impurities 120, semiconductor substrate 110 of semiconductor wafer 90 becomes significantly more pure following the annealing step which FIG. 10 shows. Besides higher purity as already indicated in FIG. 8, also higher perfection of the silicon lattice within individual grains is reached applying suitable thermodynamic conditions. Such a situation is depicted in FIG. 10, showing not only the lack of metallic impurity clusters (FIG. 8), but also the lack of structural defects, so-called dislocations within individual grains. Thermal conditions for generating structures shown in FIG. 10 include high idling temperatures, for example T>1100° C. That is, there is annealing-induced dislocation reordering occurring at the same time of propagation of impurities toward getter sites of the wire-saw damaged surfaces 92 and 94 and surface contaminant layers 96 and 98.

High temperature annealing results in stronger re-ordering of the lattice—which anneals out the damage—in conjunction with stronger vacancy injection. Vacancies are intrinsic point defects in the silicon lattice that ease the formation of large clusters of metallic impurities 118 and 120, which basically consist of intermetallic phases at applying contaminant layers of certain composition. The formation of such intermetallic phases occurs under suitable thermodynamic conditions of annealing and subsequent cooling. The intermetallic growth phase results in semiconductor substrate 110 actually becoming less damaged, with metallic impurities moving toward surfaces 92 and 94, as well as toward grain boundaries 114. Grain boundaries provide a path for the attraction of the impurities deep within semiconductor substrate 110 resulting in the formation of impurity clusters 120.

Conventional furnace annealing (horizontal tube with resistivity heating) systems exhibit two temperature ranges where the benefits appearing in FIGS. 7 and 10 occur. First of all, low temperature annealing (<950° C.) has a moderate effect (FIG. 7). On the other hand, high temperature annealing (>950° C.) has a strong effect (FIG. 10). Conventional furnace annealing (CFA) or rapid thermal annealing (RTA) may be used. In fact, RTA may provide a superior ratio of effect over time. Specific embodiments may employ conventional furnace annealing (CFA) in the temperature range of 500-1350° C., or rapid thermal annealing (RTA) also in the temperature range 500-1350° C., or even a combination of CFA and RTA. FIG. 11 shows semiconductor wafer 90 following etching and cleaning steps, which result in the removal of surface contaminant layers 96 and 98, as well as the wire-saw damaged surfaces 92 and 94. These etching and cleaning steps result in the removal of impurity clusters 112 and structural defects 110 (compare FIG. 10). In one embodiment, these steps remove approximately 10 micrometers of material on the top and bottom of semiconductor wafer 90. Thus, as FIG. 11 depicts, semiconductor substrate 110 now has a significantly lower concentration of impurities 112 in comparison to the distribution of impurities appearing in FIG. 9, representing the stage of semiconductor wafer 90 prior to the disclosed process.

FIGS. 12 and 13 are portraying the in-depth distribution 126 of electrically active species now achievable by the presently disclosed process. The wafer is rotated by 90° relative to wafers shown in FIGS. 6-11. The length L, indicated as an arrow 124, of near-surface regions with strong damage and high impurity and defect content is marked by line 122. The difference between FIG. 12 and FIG. 13 is a significant difference in wafer thickness, for example 150 μm in FIG. 12 versus 300 μm in FIG. 13. It follows that reduction in wafer thickness allows making better use of the disclosed method, since "denuded zones" are more readily exploited if going to thinner wafers.

FIGS. 14 and 15 display typical results gained at applying the disclosed process. Recombination lifetime is used as a measure of material quality. FIG. 14 shows a strong material improvement at high temperature treatment. A constant surface contamination of $10^{13}$ Fe atoms/cm$^2$ is applied in this case. FIG. 15 shows material improvement dependency on the amount of intentional Fe surface contamination. In this case the temperature of the treatment is kept constant.

In essence, therefore, the present disclosure provides a solar cell pre-processing method and system for annealing and gettering a solar cell semiconductor wafer 90 having impurities and defects 112, which are highly dispersed throughout substrate 110. The method and system provide, respectively, the steps of and means for forming a surface contaminant layer 96 and 98 on a solar cell semiconductor wafer 90. The irregular surfaces 92 and 94 are predisposed to receive and hold impurities 112. Semiconductor wafer 90, being a lower-quality, metallic grade semiconductor, includes a dispersion of impurities 112 throughout semiconductor substrate 110.

The presently disclosed process anneals semiconductor wafer 90 to a temperature sufficient for gettering impurities 112. As a result of the gettering and impurity clustering, impurity clusters 118 form near surface contaminant layers 96 and 98. That is, impurities and defects 112 transition from being generally dispersed throughout semiconductor wafer to form impurity clusters 118 at wire-saw damaged surfaces 92 and 94 during the cooling step following annealing. This increases the purity level of semiconductor wafer 90 in regions from which the impurities gettered. Etching or otherwise removing the surface contaminant layers 96 and 98, as well as the portions of wire-saw damaged surfaces 92 and 94 holding impurity clusters 118 yields a semiconductor wafer 90 having a generally higher purity level.

When using multicrystalline semiconductor for semiconductor wafer 90, the present disclosure takes advantage of generally dispersed grain boundaries 114 within the semiconductor substrate 110. The generally dispersed grain boundaries 114 include a threshold level of impurities 116. The method and system provide for performing the above-stated annealing step to a temperature sufficient for gettering the impurities 112 from being generally dispersed throughout semiconductor substrate 110 to further forming impurity clusters 120 from impurities 116 at grain boundaries 114. This aspect of the present disclosure yet further increases the purity level of semiconductor wafer 90 in regions from which impurities 112 may getter, hence contributing to the formation of impurity clusters 120.

The disclosed subject matter, therefore, includes solar cell pre-processing methods for annealing and gettering a solar cell semiconductor wafer having impurities such as transition metals and a variety of structural defects. Such impurities may include, for example dislocations in grain boundaries within individual grains. The method and system provide, respectively, the steps of and means for reducing the impurity levels in semiconductor wafers by utilizing lattice damage and related structural defects in near-surface regions of such wafers. Such lattice damage may arise from saw damaged near-surface layers of a semiconductor wafer occurring inherently from slicing blocks into wafers. Related structural defects may include dislocation networks close to the interface between wafer damage and wafer bulk. Such defects may be introduced at thermal wafer treatment, followed by controlled cooling. The semiconductor wafer, being a lower-quality MG semiconductor, includes a dispersion of impurities and defects generally throughout the semiconductor wafer. The present disclosure provides a method and process conditions for annealing the semiconductor wafer to allow favorable thermodynamic conditions to getter the impurities at lattice damage and/or structural defects.

As a result of the gettering and clustering of impurities toward the surface, the impurities transition from being generally dispersed in a semiconductor wafer to becoming concentrated close to the surfaces of respective wafers. A cooling step follows the annealing step for forming and retaining the metal-containing clusters within the surface regions. This increases the purity level of the semiconductor wafer in regions from which the impurities are gettered. The disclosed method and system remove the largely contaminated wafer surface layer, including the impurity clusters, to yield a semiconductor wafer having a generally higher purity level. Removed thicknesses may vary between 1 μm-40 μm using standard etching procedures for removal.

The disclosed subject matter, therefore, includes adding purposely at least one contaminated surface layer, containing metallic impurities with a concentration ranging from $10^{10}$-$10^{17}$ cm$^{-3}$, on top of the saw damaged surfaces of the wafer. This layer adds defined amounts of metallic species which will favor the formation of large inter-metallic clusters during the annealing treatment. Large impurity clusters form partially in the near-surface regions and thereby getter impurities, so that the procedure is similar to the one described above which involves annealing at sufficiently high temperature, cooling at a thermodynamically favorable rate and then removing the layer using standard etching techniques.

A further aspect here disclosed includes purposely introducing high concentrations of dopant atoms into saw damaged surfaces of the wafers. Dopants may be phosphorus or boron, introduced by known techniques such as use of POCl$_3$ sources. In one embodiment a dopant concentration in the range $10^{12}$-$10^{16}$ atoms cm$^{-2}$ is applied. Favorable annealing and cooling conditions of thermal treatment will move metallic impurities into such modified surface regions containing the dopant atoms. Then, removing an appropriate near-surface layer will result in a cleaner wafer.

Yet another aspect of the present disclosure includes purposely adding defined amounts of surface metals onto wafer surfaces to form large impurity clusters at grain boundaries upon annealing and cooling under favorable thermodynamic conditions. Provided a threshold metal concentration level is reached, such a self-stimulated internal gettering of metals will further increase the cleanliness of multicrystalline wafers. Furthermore, a "denuded zone" results in the form of a near-surface zone having reduced amounts of electrically active impurities. Another supporting mechanism for the generation of "denuded zones" is the redistribution of metallic impurities from the wafer bulk to near-surface layers applying thermodynamic treatment of the kind described above, for example, at using near-surface layers with added dopant atoms. Yet another mechanism, to be activated at thermodynamic treatment at temperatures beyond 1050° C., is the reduction of dislocations within individual grains of multicrystalline wafers.

Although various embodiments which incorporate the teachings of the present disclosure have been shown and described in detail herein, those skilled in the art may readily devise many other varied embodiments that still incorporate these teachings. For example, many different types of annealing steps, etch and cleaning steps and other processing steps may be performed in association with the disclosed process and system. Also the present embodiments may be implemented in a batch or single wafer processes or in repeated sequences of annealing and processing steps as herein detailed, all such modifications falling within the scope of the present disclosure. The foregoing description of the preferred embodiments, therefore, is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein, but is to be accorded the widest scope consistent with the principles and novel features disclosed herein.

What is claimed is:

1. A method for pre-processing a semiconductor wafer made of low grade silicon having a thickness of approximately 150 μm or less, and having generally dispersed defects, said semiconductor wafer comprising top and bottom near-surface layers, each near-surface layer containing enhanced amounts of lattice defects predisposed to receive and hold dispersed defects and related clusters and a bulk region with dispersed defects throughout said bulk region, the method comprising:
    preserving said lattice defects caused by mechanical damage occurring at said near-surface layers for permitting use of near-surface layers as a gettering site for said dispersed defects;
    forming said at least one surface contaminant layer in the course of wire sawing to comprise metal atoms from the group consisting essentially of Cu, Ni, Fe in the concentration range $10^{10}$-$10^{17}$ metal atoms/cm$^2$; and
    collecting said dispersed defects at said lattice defects in said near-surface layers by performing the steps of:
        annealing said semiconductor wafer to a temperature sufficient for gettering said dispersed defects to said lattice defects and related clusters within the near-surface layers;
        cooling said semiconductor wafer following said annealing step for retaining said defects as clusters predominantly within said near-surface layers, thereby increasing the impurity level of said semiconductor wafer predominantly in said near-surface layers and changing the distribution of said dispersed defects to a depth-dependent distribution within said wafers; and
        removing said near-surface layers including said impurity clusters for yielding a generally higher purity level denuded zone substantially across a remaining thickness of said semiconductor wafer.

2. The method of claim 1, further comprising the steps of forming at least one surface contaminant layer on a semiconductor wafer containing enhanced amounts of lattice defects predisposed to receive and hold defects and related clusters and removing said at least one surface contaminant layer for yielding a generally higher purity level denuded zone within said semiconductor wafer.

3. The method of claim 1, wherein said dispersed defects comprise elements from the group consisting essentially of transition metals, metallic impurities, non-metallic impurities, lattice defects, and mixed or pure clusters of said transition metals, metallic impurities, non-metallic impurities, and lattice defects.

4. The method of claim 1, further comprising the steps of:
    forming said semiconductor wafer using a multicrystalline semiconductor, said multicrystalline semiconductor comprising generally dispersed grain boundaries within said semiconductor wafer, said generally dispersed grain boundaries comprising a threshold level of defects; and performing said annealing step to a temperature sufficient for gettering said dispersed defects from being generally dispersed throughout said semiconductor wafer to further form impurity clusters and reaching a threshold concentration of transition metals at said generally dispersed grain boundaries, thereby increasing the purity level of said semiconductor wafer in regions from which said dispersed defects are gettered.

5. The method of claim 4, further comprising the step of impregnating said generally dispersed grain boundaries with said threshold level of defects.

6. The method of claim 1, further comprising the step of forming a solar cell using said semiconductor wafer.

7. The method of claim 1, further comprising the step of forming said semiconductor wafer from a multicrystalline semiconductor ingot.

8. The method of claim 1, further comprising the step of contaminating said at least one near-surface layer by purposely introducing high concentrations of dopant atoms into said at least one near-surface layer.

9. The method of claim 8 wherein said dopant atoms comprise phosphorous atoms in the concentration range $10^{12}$-$10^{17}$ atoms/cm$^2$.

10. The method of claim 8 wherein said dopant atoms comprise boron atoms in the concentration range $10^{12}$-$10^{17}$ atoms/cm$^2$.

11. The method of claim 1, further comprising the step of annealing said semiconductor wafer using conventional furnace annealing (CFA) with ramp-up rates in the range 1-20 K/min and ramp-down rates in the range 1-20 K/min in the temperature range 400 and 1300° C.

12. The method of claim 1, further comprising the step of annealing said semiconductor wafer using rapid thermal annealing (RTA) with ramp-up rates in the range 1-80 K/sec and ramp-down rates in the range 1-80 K/sec in the temperature range 400 and 1300° C.

13. A method, comprising:
wire sawing a low grade semiconductor wafer from a low grade semiconductor ingot;
introducing a controlled amount of a chemical solution of iron to a cut surface of the wafer in the course of wire sawing, wherein introducing a controlled amount of iron to a cut surface of the wafer includes introducing a chemical solution of iron to provide a surface concentration in a range of $10^{12}$-$10^{14}$ iron atoms/cm$^3$;
heating the low grade semiconductor wafer to cause migration of defects from within the low grade semiconductor wafer to at least one surface region of the low grade semiconductor wafer; and
removing the surface region.

14. The method of claim 13, wherein wire sawing a semiconductor wafer includes wire sawing a silicon wafer.

15. The method of claim 14, wherein wire sawing a silicon wafer includes wire sawing a multicrystalline silicon wafer.

16. The method of claim 13, wherein wire sawing a semiconductor wafer from a semiconductor ingot includes sawing to a thickness of approximately 150 μm or less.

17. A method, comprising:
wire sawing a multicrystalline silicon wafer from a semiconductor ingot to a thickness of approximately 150 μm or less;
introducing a chemical solution of iron to a cut surface of the wafer in the course of wire sawing to provide a surface concentration in a range of $10^{12}$-$10^{14}$ iron atoms/cm$^3$;
heating the wafer to cause migration of defects from within the wafer to a top and bottom surface region of the wafer; and
removing approximately 10 μm of both the top and bottom surface regions to provide a substantially consistent denuded zone across a remaining thickness of the wafer.

18. The method of claim 17, wherein heating the wafer includes using conventional furnace annealing (CFA) with ramp-up rates in the range 1-20 K/min and ramp-down rates in the range 1-20 K/min in the temperature range 400 and 1300° C.

19. The method of claim 17, wherein heating the wafer includes using rapid thermal annealing (RTA) with ramp-up rates in the range 1-80 K/sec and ramp-down rates in the range 1-80 K/sec in the temperature range 400 and 1300° C.

* * * * *